(12) United States Patent
Bellorado et al.

(10) Patent No.: US 11,265,000 B1
(45) Date of Patent: Mar. 1, 2022

(54) MAGNETORESISTIVE ASYMMETRY COMPENSATION

(71) Applicant: Seagate Technology LLC, Fremont, CA (US)

(72) Inventors: Jason Bellorado, San Jose, CA (US); Marcus Marrow, San Jose, CA (US); Zheng Wu, Los Altos, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/162,411

(22) Filed: Jan. 29, 2021

(51) Int. Cl.
| | | |
|---|---|---|
| G11B 20/10 | (2006.01) | |
| G11B 5/00 | (2006.01) | |
| H03M 1/06 | (2006.01) | |
| H03G 3/30 | (2006.01) | |
| G11B 5/027 | (2006.01) | |
| G11B 5/012 | (2006.01) | |

(52) U.S. Cl.
CPC ............. *H03M 1/06* (2013.01); *G11B 5/012* (2013.01); *G11B 5/027* (2013.01); *G11B 20/10324* (2013.01); *H03G 3/30* (2013.01); *H03G 2201/103* (2013.01)

(58) Field of Classification Search
CPC .......... G11B 27/36; G11B 20/08; G11B 5/09; G11B 20/10009; G11B 20/10027; G11B 5/00; G11B 5/035; G06F 13/102; G06F 13/4221; H03G 3/20; H03M 1/12
USPC ............................. 360/25, 31, 32, 64, 46, 67
See application file for complete search history.

(56) References Cited

U.S. PATENT DOCUMENTS

| | | | |
|---|---|---|---|
| 6,633,447 B2 | 10/2003 | Franck et al. | |
| 7,768,730 B2 | 8/2010 | Bliss et al. | |
| 7,929,240 B2 | 4/2011 | Mathew et al. | |
| 8,904,070 B2 | 12/2014 | Ratnakar Aravind et al. | |
| 2007/0076313 A1 | 4/2007 | Hutchins et al. | |
| 2014/0029128 A1* | 1/2014 | Zhang | H03G 3/3052 360/46 |

* cited by examiner

*Primary Examiner* — Nabil Z Hindi
(74) *Attorney, Agent, or Firm* — Kirk A. Cesari; Christian W. Best

(57) ABSTRACT

Systems and methods are disclosed for magnetoresistive asymmetry (MRA) compensation using a digital compensation scheme. In certain embodiments, a method may comprise receiving an analog signal at a continuous-time front end (CTFE) circuit, and performing analog offset compensation to constrain an extremum of the analog signal to adjust a dynamic range based on an input range of an analog-to-digital converter (ADC), rather than to modify the analog signal to have a zero mean. The method may further comprise converting the analog signal to a digital sample sequence via the ADC; performing, via a digital MRA compensation circuit, digital MRA compensation on the digital sample sequence; receiving, via a digital backend (DBE) subsystem, the digital sample sequence prior to digital MRA compensation; and generating, via a DBE, a bit sequence corresponding to the analog signal based on an output of the DBE subsystem and an output of the digital MRA compensation circuit.

20 Claims, 10 Drawing Sheets

US 11,265,000 B1

MAGNETORESISTIVE ASYMMETRY COMPENSATION

SUMMARY

In certain embodiments, an apparatus may comprise a continuous-time front end (CTFE) configured to receive an analog signal, and perform analog offset compensation to constrain the extrema of the analog signal to adjust a dynamic range of the analog signal based on an input range of an analog-to-digital converter (ADC), rather than to modify the analog signal to have a zero mean. The apparatus may further comprise the ADC, configured to convert the analog signal to a digital sample sequence; a digital magnetoresistive asymmetry (MRA) compensation circuit configured to perform digital MRA compensation on the digital sample sequence; a digital backend (DBE) subsystem configured to receive the digital sample sequence prior to digital MRA compensation; and a DBE configured to produce a bit sequence corresponding to the analog signal based on an output of the DBE subsystem and an output of the digital MRA compensation circuit.

In certain embodiments, a method may comprise receiving an analog signal at a continuous-time front end (CTFE) circuit, and performing, via the CTFE circuit, analog offset compensation configured to constrain the extrema of the analog signal to adjust a dynamic range of the analog signal based on an input range of an analog-to-digital converter (ADC), rather than to modify the analog signal to have a zero mean. The method may further comprise converting the analog signal to a digital sample sequence via the ADC; performing, via a digital magnetoresistive asymmetry (MRA) compensation circuit, digital MRA compensation on the digital sample sequence; receiving, via a digital backend (DBE) subsystem, the digital sample sequence prior to digital MRA compensation; and generating, via a DBE, a bit sequence corresponding to the analog signal based on an output of the DBE subsystem and an output of the digital MRA compensation circuit.

In certain embodiments, a memory device may store instructions that, when executed, cause a processor to perform a method comprising receiving an analog signal at a continuous-time front end (CTFE) circuit, and performing, via the CTFE circuit, analog offset compensation configured to constrain the extrema of the analog signal to adjust a dynamic range of the analog signal based on an input range of an analog-to-digital converter (ADC), rather than to modify the analog signal to have a zero mean. The method may further comprise converting the analog signal to a digital sample sequence via the ADC; performing, via a digital magnetoresistive asymmetry (MRA) compensation circuit, digital MRA compensation on the digital sample sequence; receiving, via a digital backend (DBE) subsystem, the digital sample sequence prior to digital MRA compensation; and generating, via a DBE, a bit sequence corresponding to the analog signal based on an output of the DBE subsystem and an output of the digital MRA compensation circuit.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules or nodes, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
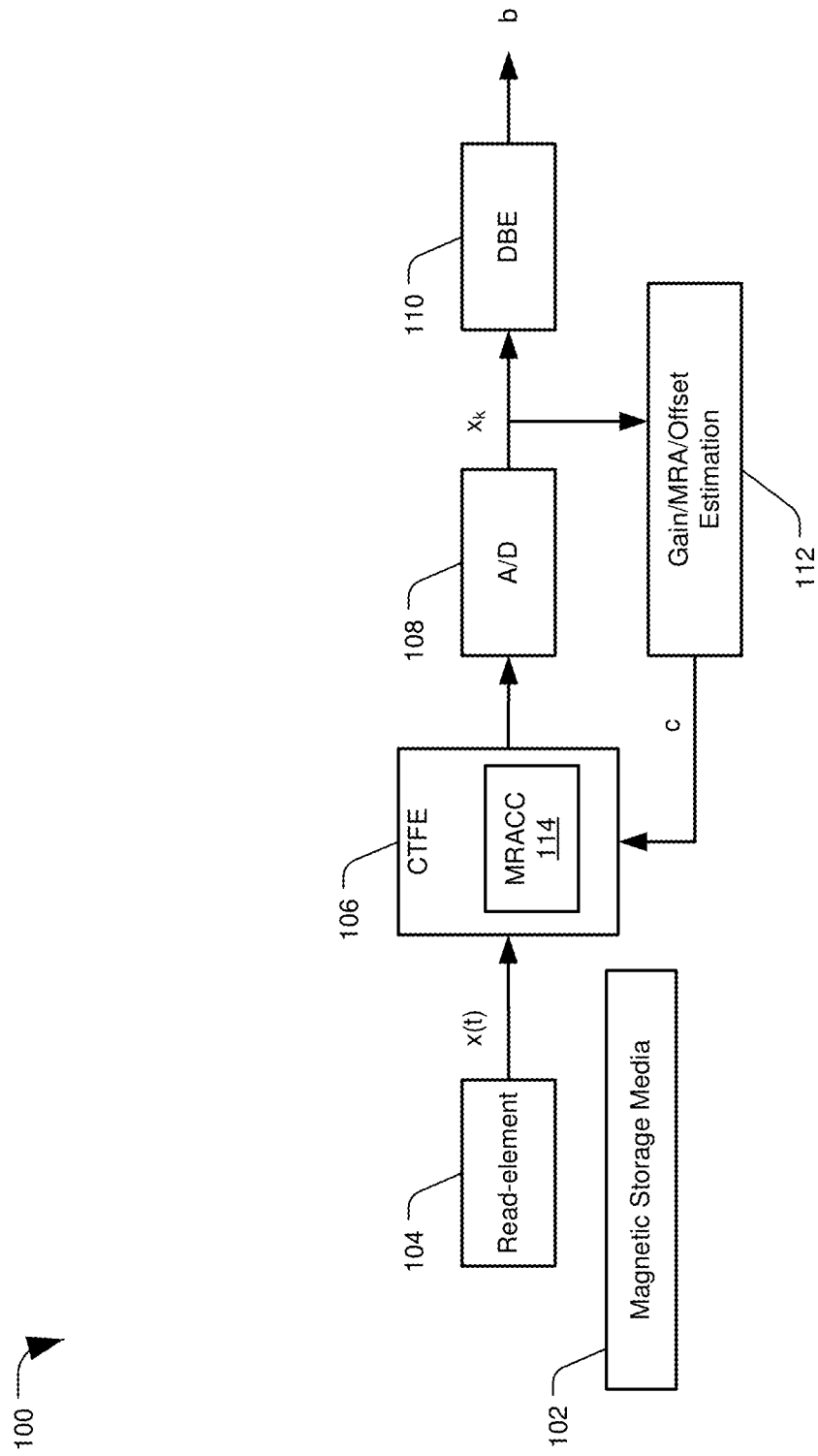
FIG. 1 is a diagram of a system configured for magnetoresistive asymmetry compensation, in accordance with certain embodiments of the present disclosure.

FIG. 1 is a diagram of a system 100 configured for magnetoresistive asymmetry compensation, in accordance with certain embodiments of the present disclosure. System 100 may include a data processing channel configured to convert analog signals into a digital bit sequence, such as a read/write (R/W) channel in data storage device. An example system 100 may include a magnetic storage medium 102, a read element 104, a continuous-time front-end (CTFE, sometimes called an analog front end, AFE) 106, an analog-to-digital converter (A/D or ADC) 108, a gain/magnetoresistive asymmetry (MRA)/offset estimation module or block 112, and a digital backend (DBE) 110. The CTFE 106 may include components to process and condition an analog signal, such as a variable gain amplifier (VGA) and an MRA compensation circuit (MRACC) 114. The DBE 110 may include components configured to determine a user bit sequence from a digital sample sequence, such as a Viterbi detector and decoder.

In the field of magnetic recording, such as for hard disc drives (HDDs), data can be read from its stored location on magnetic storage media 102 by passing a read-element 104 (sometimes called a read head, transducer, or simply "head") over the portion of the magnetized surface 102 containing the data to be retrieved. The read-element 104, exhibiting a quantum mechanical property known as magnetoresistance (MR), has an electrical resistance that is governed by an externally applied magnetic field. As a result, a current passing through the read-element 104 may be modulated by the magnetic polarization of the nearby media 102, giving rise to an electrical signal with a signature that is indicative of the written data pattern. This waveform can be passed to the hard-disk drive controller or read/write channel for demodulation and for recovery of the stored data sequence.

System 100 can be used to process such a waveform. Here, the waveform (x(t)) obtained from the read head 104 may first be applied to the CTFE 106 to process the analog signal and condition it for sampling by the A/D 108. The resulting digitized sample sequence $\{x_k\}$ may be applied both to the DBE 110, which can perform all operations necessary to recover the written data, and to a gain/MRA/offset estimation block 112, which can generate a control signal (c) to be applied back to the CTFE 106. This control signal (c) may allow for adjustments in the CTFE 106 processing to facilitate the DBE's 110 data recovery operation. For example, in the event that the amplitude of the readback signal is deemed too small, the control signal (c) will adjust the gain imparted by a variable gain amplifier block within the CTFE 106, thus increasing the signal amplitude to more closely match that expected by the DBE 110. A difficulty that can arise in reading data from a magnetic storage medium 102 is discussed in regard to FIG. 2.

Figure 2:
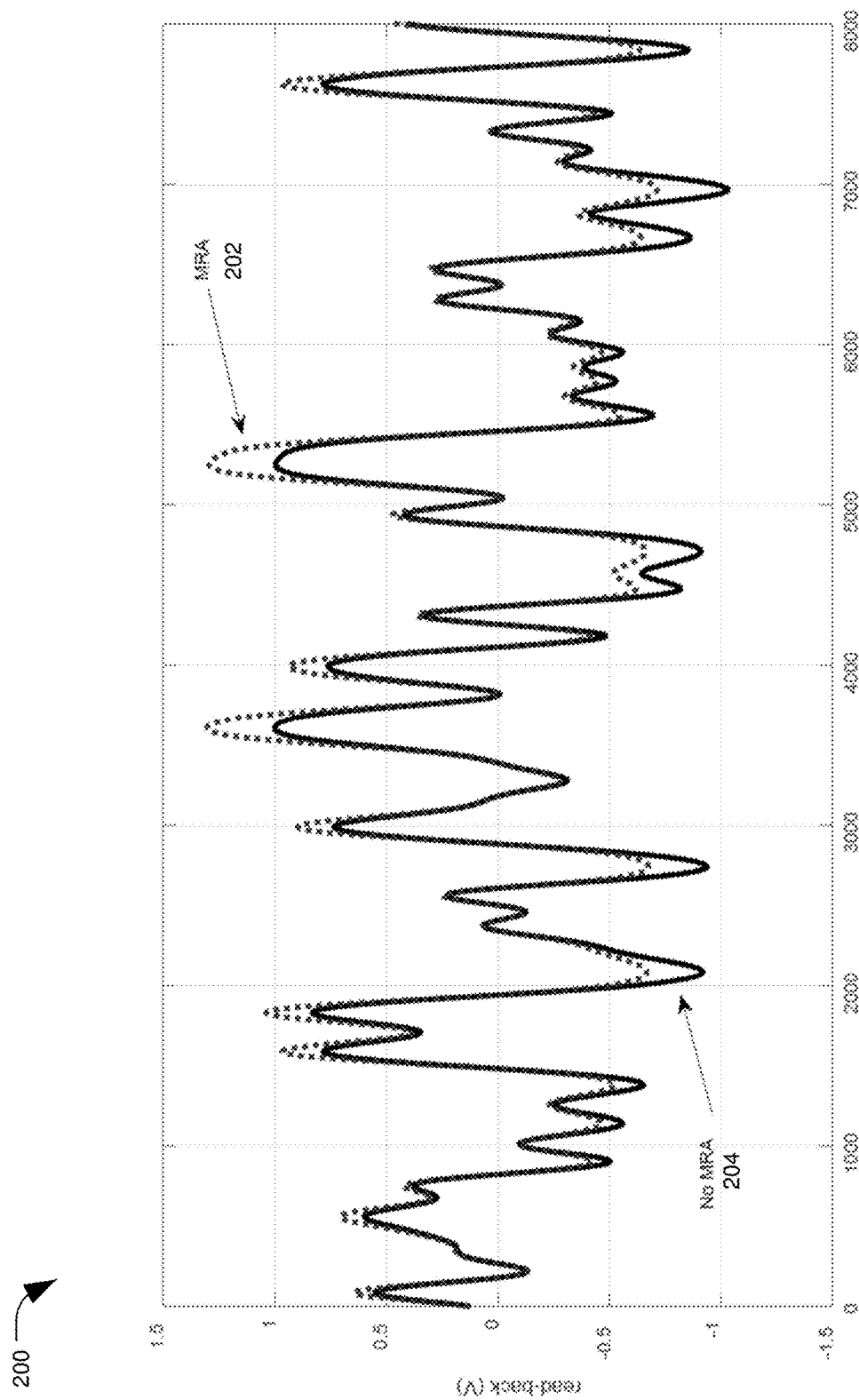
FIG. 2 is a graph of waveforms for magnetoresistive asymmetry compensation, in accordance with certain embodiments of the present disclosure.

FIG. 2 is a graph 200 of waveforms for magnetoresistive asymmetry compensation, in accordance with certain embodiments of the present disclosure. The waveforms of graph 200 may correspond to waveforms from a read-element 104 of system 100 of FIG. 1. An undesirable property exhibited by some MR read-elements 104 which can hinder the successful recovery of data is a phenomenon known as magnetoresistive asymmetry (MRA). For such read-elements 104, the resistive response is asymmetric with respect to the polarity of an applied magnetic field. The resulting read-back waveforms may appear as illustrated in FIG. 2 in the presence of MRA (represented by dashed waveform 202) and absence of MRA (represented solid waveform 204). As shown, the waveform with MRA 202 appears similar to a DC (direct current) offset in the signal; however, its magnitude may vary with the signal's amplitude. For portions of the MRA waveform 202 near zero, the two signals appear similar; however, for portions of the MRA signal 202 significantly away from zero, the disparity of the waveforms becomes increasingly large. It is often the case that magnitude of the MRA present in the read-back signal is an exponential function of its instantaneous amplitude.

A difficulty that may be encountered in working with read-elements 104 exhibiting MRA may be the efficient utilization of the input dynamic range of the A/D 108. Here, an A/D 108 may operate by sampling an applied voltage waveform, translating a specified range of input voltages to digitized (integer) values. Regarding the MRA-absent (solid) waveform 204 depicted in FIG. 2, it would be appropriate for the voltage range of [−1,+1] Volts to be used for the A/D 108 input range, as the non-MRA waveform 204 uses approximately the whole range, without significantly exceeding that range. If, for example, a 6-bit A/D 108 were employed, this voltage range would be uniformly quantized into the set {−32, −31, . . . , +31}. If, however, that same input range was used for the MRA-present (dashed) waveform 202, all samples with voltage greater than +1 Volt would be saturated to the largest digital value (+31 in this example), resulting in significant loss of detail from the waveform 202. Furthermore, since no voltage less than approximately −0.6 Volts is observed in the MRA-present waveform 202, about 20% of the A/D 108 input voltage range is left unused—a result known as quantization. For the 6-bit example this would mean that digitized values {−32, −31, . . . , −20} would never appear, which effectively removes ~0.3 bits from the A/D 108 range (only 52 of the 64 levels are utilized). A larger A/D 108 input dynamic range could be utilized, such as [−1.3, +1.3] Volts, to accommodate the possible presence of MRA in the signal. Such an approach may obviate the saturation issue described above; however, the A/D 108 quantization is made worse by ~30% (each A/D bit may correspond to 40.6 mV rather than 31.25 mV) and levels {−32, −31, . . . , −16} would then be left unused. In practice, the magnitude and polarity of MRA may vary across read elements (an example HDD can have 40 or more read elements), can change over time, and may be in excess of 40% of the signal 202 amplitude. As such, designing a system to accommodate all possibilities is extremely difficult.

To ameliorate the effect of MRA on A/D 108 conversion, one approach is to implement an MRA cancellation or compensation circuit (MRACC) 114 in the CTFE 106 which attempts to cancel the MRA prior to A/D 108 sampling. With this approach, the MRA present in the signal may be estimated and an appropriate control signal may be applied back to the CTFE 106, such that the MRA may be compensated for. Theoretically, a signal appearing as the dashed waveform 202 can be corrected to appear as the solid signal 204 before application to the A/D 108. Although this approach can be effective at mitigating the effects of MRA on A/D 108 conversion, there may be several significant shortcomings to this approach:

Difficulty 1: The implementation of an analog MRA compensation circuit 114 can be complex, consume a substantial amount of power, and introduce distortion into the signal path. The power aspect can be particularly troublesome, as the power consumed by analog circuits may not scale as well as their digital counterparts when newer fabrication process technologies are utilized.

Difficulty 2: An example hard-disk controller compensation circuit 114 may compensate for MRA in the range of −40% to +40% of the signal amplitude. Since the design of an analog MRA compensation circuit 114 that supports a large number of discrete compensation values can be exceedingly difficult, this (rather large) range may need to be spanned using a limited number of compensation levels. If, for example, a 4-bit (16 level) compensation circuit 114 is implemented to span this range, the change of a single bit would correspond to a 5.0% change in the associated MRA compensation. This can present a real practical challenge as it is often desirable to allow the MRA compensation value to adapt such that variations in MRA may be tracked during read operations. As is the case in any digital adaptation procedure, it may not be possible to avoid an adapting compensation value from toggling between a few levels, which can add significant noise to the read-back signal. As a result, adapting the MRA compensation is often not feasible due to its inherent degradation in signal quality.

Difficulty 3: For some systems implemented in the DBE 110 it may be a requirement that the applied signal must have no MRA compensation applied. (See, e.g. U.S. Pat. No. 7,885,025 B2, which discusses using the non-linearities in a readback signal to discern the reader deviation from a written track center. This process may not function if the MRA is cancelled from a signal.) In systems where the earliest available digitized values already have MRA compensation applied (e.g. in the CTFE 106 prior to digitization in the A/D 108), such a criterion may not be possible to meet.

Improved architectures are therefore presented herein, which may be used to obviate some or all of these difficulties associated with magnetic read-elements exhibiting MRA, and allow for adaptive MRA compensation without any degradation in resulting signal quality.

In a first example, a hybrid analog/digital architecture is detailed in which the analog MRA compensation may be set to a fixed value, with the objective of removing the majority of the MRA present in the signal prior to A/D 108 sampling. Although compensating for a fixed value may allow for an efficient use of the A/D 108 input dynamic range, static compensation can lead to residual MRA being present in the digitized samples. To address this, a digital subsystem may be added capable of estimating and compensating for MRA and DC offsets. The digital implementation of this functionality may be made with high enough precision such that it may be allowed to adapt without compromising signal quality. The proposed hybrid architecture may be used to effectively avoid difficulty 2) but, due to the presence of an analog MRA compensation circuit and the fact that non-MRA compensated samples are not available, it may be unable to fully address difficulties 1) or 3).

To assuage the remaining difficulties, several all-digital architectures are also presented herein. With the analog MRA compensation circuit 114 absent, the analog offset compensation may be modified to contain the positive and negative extrema of the signal, rather than its traditional functionality of driving the signal mean to zero. This approach may allow for efficient utilization of the A/D 108 input range, albeit at the expense of generating digitized samples with non-zero mean and non-zero MRA. A similar high-precision digital compensation approach as proposed in the previous example can be also utilized to generate a zero-mean, MRA-free input to the DBE 110. As was the case with the hybrid analog/digital architecture, the digital MRA compensation may be allowed to adapt without compromising signal quality to obviate difficulty 2). Since all-digital architectures may impart no MRA compensation to the signal prior to A/D 108 sampling, they can also obviate difficulties 1) and 3).

Figure 3:
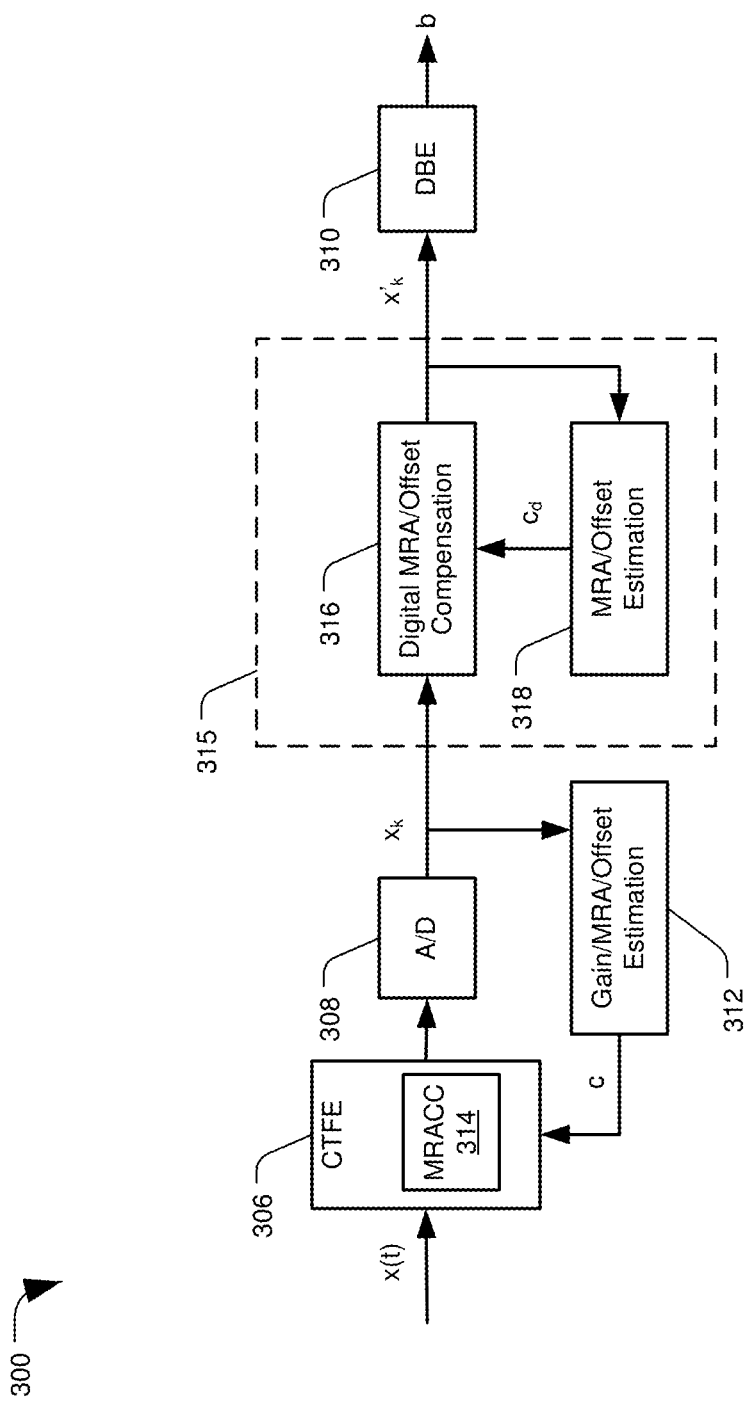
FIG. 3 is a diagram of a system configured for magnetoresistive asymmetry compensation, in accordance with certain embodiments of the present disclosure.

As outlined in Difficulty 2 above, it is often the case that a wide range of MRA compensation is required but, due to complexities in the analog circuit design, only a small number of compensation levels is feasible to implement. As a result, a single bit change in the specified MRA compensation level can cause a significant change in the applied compensation. Since adapting the MRA compensation can lead to a dithering between several compensation levels, this can act to degrade the signal quality significantly enough to outweigh any benefits afforded by adaptation. FIG. 3 depicts an architecture to address this difficulty.

FIG. 3 is a diagram of a system 300 configured for magnetoresistive asymmetry compensation, in accordance with certain embodiments of the present disclosure. In particular, FIG. 3 depicts an example a hybrid analog/digital architecture for MRA compensation, and a corresponding signal processing methodology.

In the proposed methodology, the (analog) CTFE 306 architecture, the (digital) gain, MRA, and offset estimation 312 architecture, and corresponding compensation values $\{c\}$ to the CTFE (shown on the left hand side of system 300) may remain unchanged from the architecture of FIG. 1, as does the operation of the DBE 310. In between these systems is the addition of a digital compensation subsystem or circuit 315 (indicated with a dashed box) capable of compensating for offsets and MRA present in the digitized sample sequence $\{x_k\}$. The digital compensation subsystem 315 may include a digital MRA and offset compensation module or circuit 316, which may process an input digital sequence $\{x_k\}$, and output digital sequence $\{x'_k\}$ to the DBE 310. As shown, the DBE 310 input sequence $\{x'_k\}$ may also be applied to an MRA/Offset Estimation module or circuit 318 of the digital subsystem 315 to generate estimates of the underlying MRA and DC offset and to produce the control signal $\{c_d\}$. The level of compensation indicated by $\{c_d\}$ may, then, be applied to the input samples $\{x_k\}$ by the Digital MRA/Offset Compensation block 316 to reduce or eliminate remaining MRA and offset effects. The processing of the applied sample sequence $\{x_k\}$ may generate the DBE input sequence $\{x'_k\}$ with zero DC offset and free of MRA.

In the proposed architecture of system 300, the addition of a second layer of MRA and offset compensation in the digital domain, to complement the MRACC 314 processing performed in the analog domain, allows for the possibility that the digitized sample sequence $\{x_k\}$ contains residual MRA (and, potentially, DC offsets). As a result, rather than allowing the MRACC 314 compensation conducted in the CTFE 306 to adapt, it is proposed that the MRACC 314 compensation be fixed to a nominal value for all data-recovery operations. The selection of the nominal value is discussed below. An objective of the hybrid architecture of FIG. 3 may be for the magnitude of analog MRA compensation to be selected to cancel the majority of the MRA prior to A/D 308 sampling, such that the A/D 308 input range may be efficiently utilized. With the analog MRA compensation fixed, any residual MRA and DC offset present in the digitized samples $\{x_k\}$ may be corrected in the digital domain. This digital implementation of MRA and offset compensation, an example of which is shown in FIG. 4, may be less complex than its analog counterpart.

Figure 4:
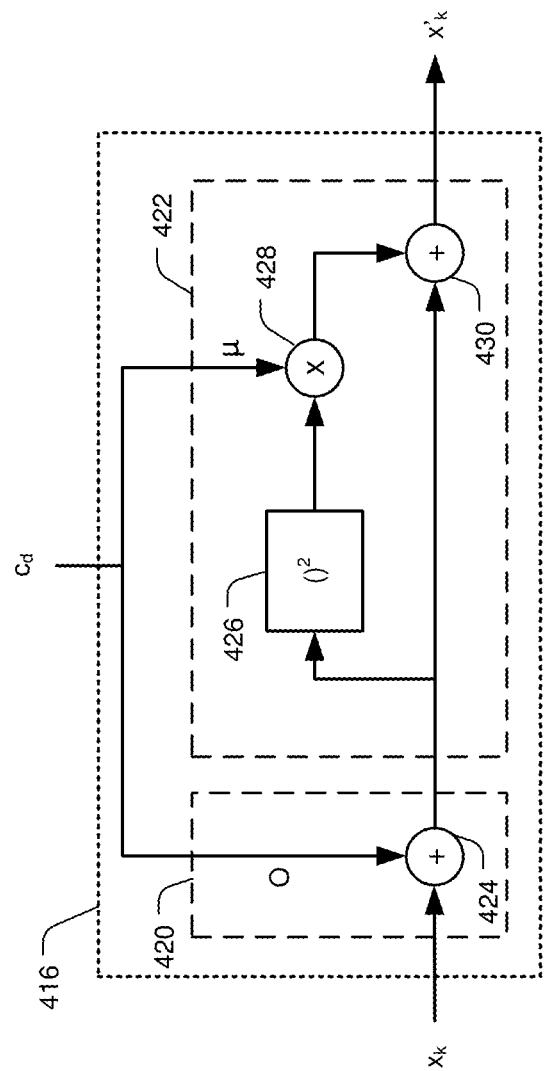
FIG. 4 is a diagram of a system configured for magnetoresistive asymmetry compensation, in accordance with certain embodiments of the present disclosure.

FIG. 4 is a diagram of a system 400 configured for magnetoresistive asymmetry compensation, in accordance with certain embodiments of the present disclosure. In particular, FIG. 4 depicts an example digital MRA and DC offset compensation module 416, which may be incorporated into a hybrid analog and digital MRA-compensation architecture, and may correspond to digital MRA/offset compensation block 316 of FIG. 3.

In the example MRA/offset compensation module 416, the applied MRA and DC offset compensation control signal $\{c_d\}$ may be broken into its offset (O) and MRA ($\mu$) compensation values, which can be applied to the signal $\{x_k\}$ in succession via an offset compensation component 420 and an MRA compensation component 422. The offset compensation may be applied via an adder 424. The MRA compensation component 422 may receive the offset-compensated signal from the offset compensation component 420, and apply the signal to a squaring operation 426, which may be implemented using a small look-up table, and a multiplier 428 for the specified compensation value ($\mu$). The output of the multiplier 428 may be combined with the unmodified offset-compensated signal from the offset compensation module 420 at an adder 430 to produce the output signal $\{x'_k\}$. Since the precision of the applied MRA compensation may only dictate the width of the required multiplier, and because multipliers of 8 or more bits may be implemented in digital logic without difficulty, significantly higher precision may be implemented for digital MRA compensation than its analog variant. The increased digital precision allows for adaptation without a degradation in signal quality, as the change in applied compensation caused by dithering between several levels can be made arbitrarily small though use of increasingly high precision.

Returning to FIG. 3, for the selection of the (fixed) analog MRA compensation value applied by the MRACC 314, the analog compensation value may be selected based on the observed magnitude of the MRA in signal applied to the digital MRA compensation circuit 315. It is reiterated that the level of digital MRA compensation (e.g. $\mu$ in FIG. 4) depends only on the residual MRA in the applied samples $\{x_k\}$. If, for example, the MRA is fully cancelled in the CTFE 306, the digital compensation block 315 may settle to zero compensation. As a result, the adapted digital compensation magnitude may provide a direct measure of how "appropriately" the analog compensation has been set (e.g. the magnitude of residual MRA in the digitized samples $\{x_k\}$, which may directly correspond to the efficiency of A/D 308 input range utilization). Therefore, in the example architecture of system 300, the digital compensation level can be applied or compared to a threshold such that, when the digital compensation magnitude becomes too large, the analog compensation value may be adjusted or recalculated. Therefore the analog MRA compensation value may only be "fixed" during read and recovery operations, but may otherwise be adjusted or calibrated in-between reads. The analog compensation value adjustment process could be accomplished by, for example, conducting a test-read (e.g. a read that is not intended for data recovery) with the analog MRA compensation set to adaptive (e.g. automatically adjusted by the hardware), or the analog compensation value could be adjusted manually. The analog compensation value adjustment could also be accomplished by incrementing or decrementing the analog MRA compensation value in between data-recovery reads when the applied digital compensation magnitude moves away from zero. This would allow for the analog compensation to be set to reduce the residual MRA in the digitized samples and, thus, more efficiently utilize the A/D 308 input dynamic range. The digital MRA compensation value, then, may remove any variation which will show up as residual MRA in the samples.

Although the magnitude of digital MRA compensation can provide a convenient metric for determining how appropriate the level of analog MRA compensation is, the examples provided herein are not limited to embodiments where the analog MRA compensation is set based on the digital MRA compensation values. Another possible method to set the analog MRA compensation is to utilize one or more counters which count the number of samples at positive and negative saturation, or above threshold values. For example, if the samples are 6-bits (e.g. in the range [−32, 31]), counters may be configured to count samples above +30 and below −30. The observation of one of these counters starting to dominate (e.g. when the difference between the counters passes a threshold value) could also be used trigger the recalibration of the analog MRA compensation level.

With regard to the three main difficulties outlined above, the hybrid analog/digital compensation example of FIG. 3 may primarily address difficulty 2). The existence of the analog MRA compensation circuit 314 and the fact that non-MRA compensated samples are not available illustrates that difficulties 1) and 3), respectively, may still arise in the proposed architecture of FIG. 3. However, this architecture does address some difficulties in MRA compensation, and may require fewer changes to existing architecture than the embodiments that follow.

Architectures in which the MRA compensation is handled entirely in the digital domain may address more of the listed difficulties. Since the mere presence of an analog MRA compensation circuit 314 in the CTFE 306 may be the cause of difficulty 1), a method of avoiding this may be to remove the MRACC 314 from the CTFE 306. The graph of FIG. 2 can help to illustrate the implications of removing the MRACC 314.

As previously discussed, FIG. 2 shows a read-back signal in the presence of MRA 202 and in the absence of MRA 204. The effects of MRA on signal 202 could easily be mistaken for a DC offset, so it is reasonable to expect that the magnitude of analog DC offset compensation determined by the offset estimation module 312 may be affected by residual MRA left in the digitized samples $\{x_k\}$ after passing through the A/D 308. In some examples, therefore, "traditional offset compensation" may be applied to the MRA signal 202, without applying MRA compensation. Here, "traditional offset compensation" may refer to the application of a DC offset intended to drive the signal's mean to zero. For example, blocks of samples can be summed together and, if the value is positive, the offset compensation is made more negative, or vice-versa. The end result may converge to having a zero mean for the observed samples. In example of FIG. 2, the applied DC offset compensation may reduce the positive peaks of the MRA signal 202; however, it may not center the signal 202 about zero as would be required to efficiently utilize the A/D 308 input range. Traditional offset compensation may therefore help, but not completely mitigate, the effect of residual MRA on A/D 308 input range utilization.

Since "traditional offset compensation" may be unable to center the signal containing MRA 202, a modification to the analog offset compensation is proposed herein which, rather than attempt to make the signal 202 zero mean, acts to constrain the extrema of the signal 202. An example is given in formula (1), $$u_k = \begin{cases} -\delta & \text{for } x_k \geq \tau_+ \\ +\delta & \text{for } x_k \leq -\tau_- \\ 0 & \text{for } -\tau_- < x_k < \tau_+ \end{cases} \quad (1)$$

where an update ($u_k$) is made to the analog offset compensation level applied by the CTFE 306 only when an A/D 308 sample ($x_k$) is larger than a positive threshold ($\tau_+$) or is smaller than a negative threshold ($\tau_-$), with a change in the offset compensation level from the update equal to δ. For example, when this update formula (1) with parameters $\tau_+ = \tau_- = 1.0$ is utilized for the signal containing MRA 202, initially only updates corresponding to the top equation in (1) will be made (since the signal 202 exceeds 1, but never falls below −1). These updates may drive the offset increasingly negative until samples below −1 are observed. Samples below −1 will, then, drive the offset in the positive direction to counter the negative direction being applied to the offset compensation. This method may effectively center the signal 202 on the input range of the A/D 308, thus allowing for efficient use of its input dynamic range. Unlike traditional offset compensation, equation (1) may only look at large samples and try to adjust the offset compensation to limit the samples that are large and positive and large and negative. This may constrain the positive and negative extrema of the signal, but may not yield a zero mean signal as would be the case for traditional offset compensation. An example architecture to implement digital MRA compensation is described in regard to FIG. 5.

Figure 5:
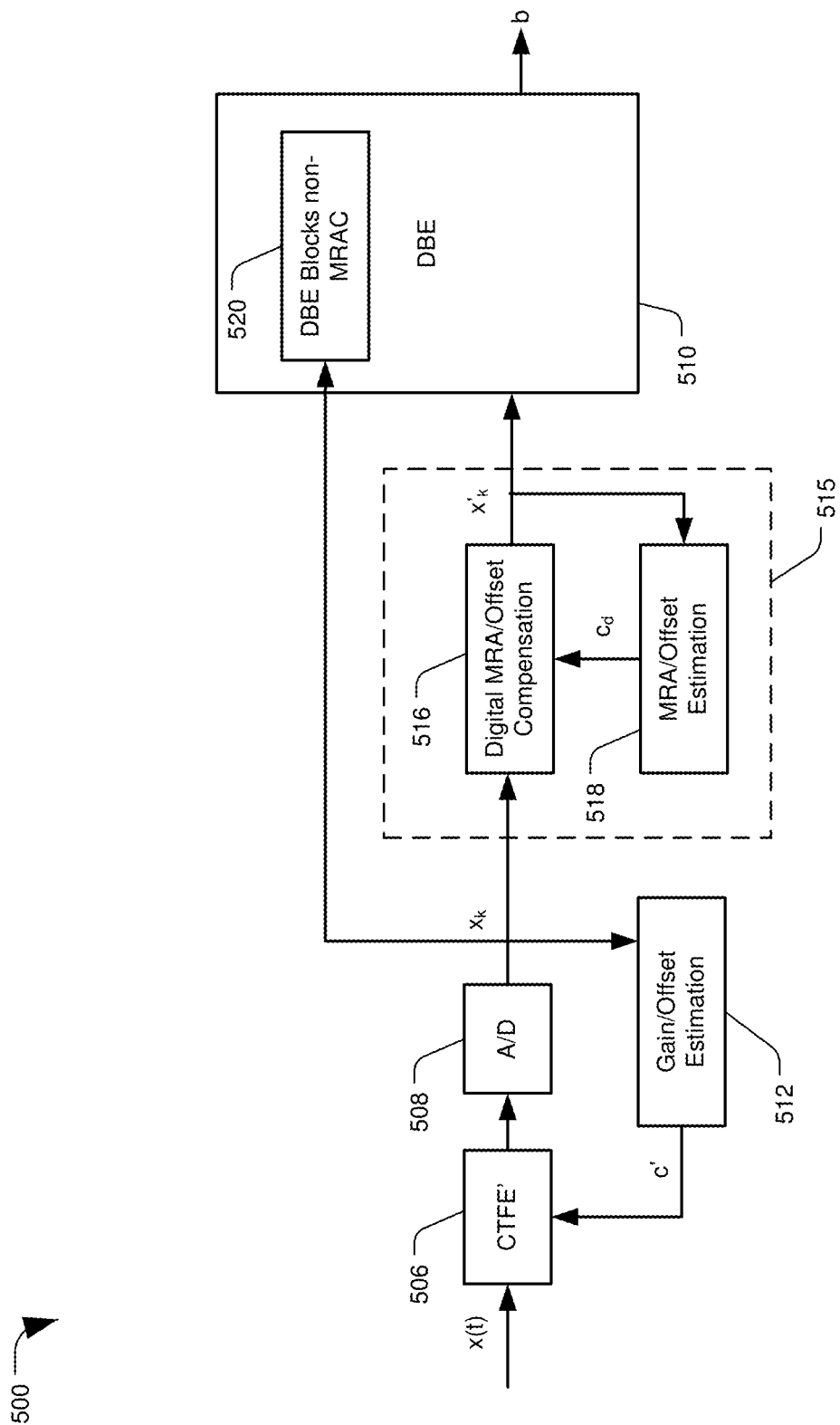
FIG. 5 is a diagram of a system configured for magnetoresistive asymmetry compensation, in accordance with certain embodiments of the present disclosure.

FIG. 5 is a diagram of a system 500 configured for magnetoresistive asymmetry compensation, in accordance with certain embodiments of the present disclosure. In particular, FIG. 5 depicts an example all-digital MRA compensation architecture.

The proposed all-digital architecture of system 500 may mitigate the three difficulties with MRA compensation previously outlined. As discussed, the analog MRA compensation circuit 314 has been removed from the CTFE 506, which is here denoted as CTFE' 506. Here, the modified control signal $\{c'\}$ applied to the CTFE' 506 from the gain and offset estimation module 512 may not include the MRA compensation value, and may implement an offset compensation scheme that limits the positive and negative extrema of the signal $\{x_k\}$, for example by using the formula (1). As proposed in the regard to FIG. 3, the A/D 508 sample sequence $\{x_k\}$ may be applied to a digital subsystem 515 configured to perform both MRA and offset estimation (e.g. via module 518) and compensation (e.g. via module 516) to generate the input sample sequence $\{x'_k\}$ to the DBE 510. The digital subsystem 515 may be configured to remove residual MRA in the signal which, due to the lack of analog MRA compensation, may be the entirety of the MRA in the readback signal. Because of the proposed modification of the analog offset compensation criterion to limit the extrema of the signal, the A/D 508 sample sequence $\{x_k\}$ likely has non-zero mean. Therefore, implementing digital offset compensation in addition to the digital MRA compensation can help address the remaining DC offset in the signal. As such, the residual MRA and DC offset in the A/D 508 output sequence $\{x_k\}$ are both compensated for by the Digital MRA/Offset Compensation block 516 to generate the DBE 510 input sequence $\{x'_k\}$ that is free of DC offsets and MRA.

By removing the analog MRA compensation from the system 500, difficulty 1) is addressed. Due to the improved granularity of digital MRA compensation relative to analog compensation, difficulty 2) is addressed. Another distinct advantage of the all-digital architecture depicted in FIG. 5 may be that, because no MRA compensation is performed in the CTFE' 506, the A/D 508 output sequence $\{x_k\}$ may be applied directly to subsystems that require samples free of MRA compensation, thereby addressing difficulty 3). These subsystems that require no MRA compensation (MRAC) may be grouped into a generic subsystem labeled DBE Blocks non-MRAC 520. The DBE Blocks non-MRAC 520 may be part of the general DBE 510, although they are not limited thereto. It is noted that, although the sample sequence $\{x_k\}$ does not have MRA compensation applied, it could have a (potentially large) non-zero mean, which may affect the operation of the non-MRAC DBE blocks 520. To address this, another architecture is proposed in regard to FIG. 6.

Figure 6:
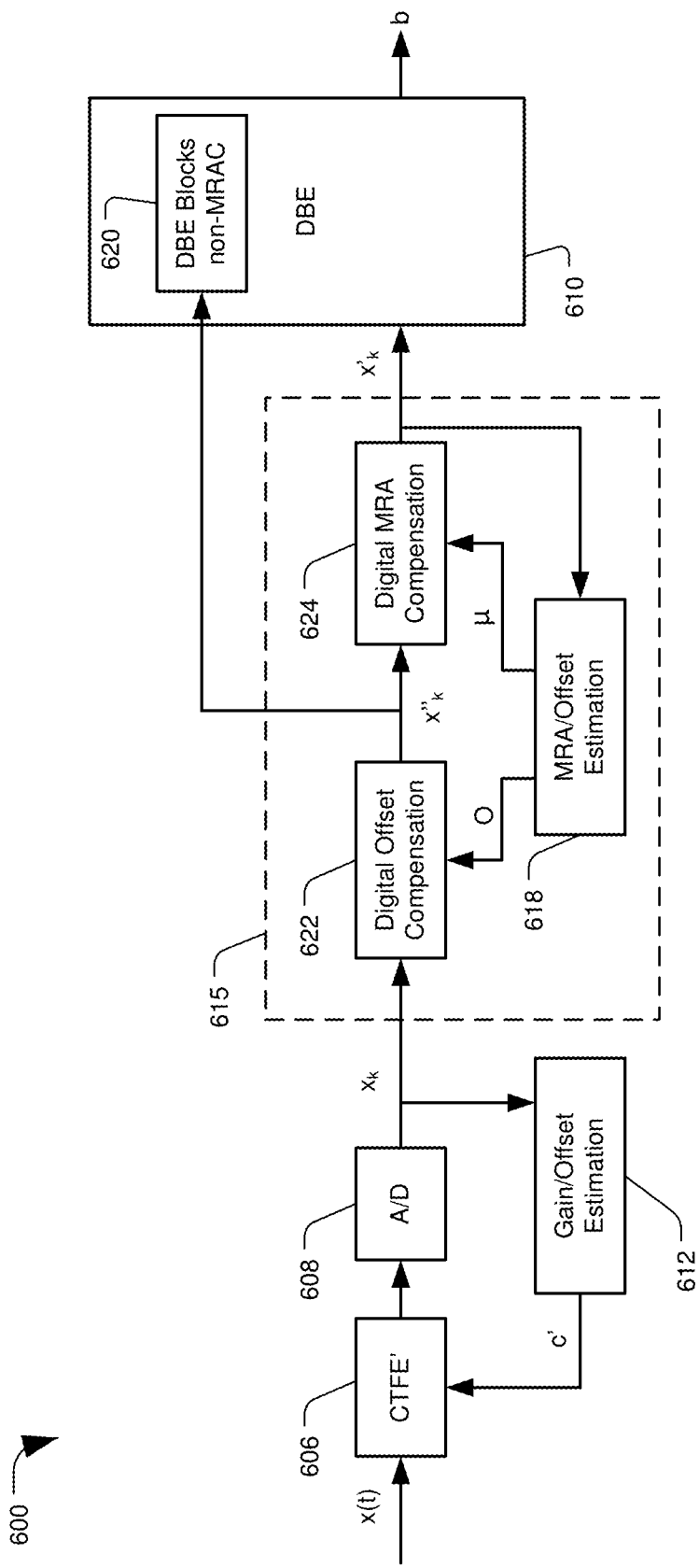
FIG. 6 is a diagram of a system configured for magnetoresistive asymmetry compensation, in accordance with certain embodiments of the present disclosure.

FIG. 6 is a diagram of a system 600 configured for magnetoresistive asymmetry compensation, in accordance with certain embodiments of the present disclosure. The components CTFE' 606, A/D 608, gain/offset estimator 612, DBE 610, and DBE blocks non-MRAC 620 may correspond to the same components of FIG. 5, and will not be described again for the sake of brevity.

In particular, FIG. 6 depicts an example all-digital MRA compensation architecture, in which the Digital MRA/Offset Compensation module 516 of FIG. 5 has been split into a cascade of a Digital Offset Compensation module 622 and a Digital MRA Compensation module 624 within digital subsystem or circuit 615. Rather than the MRA/offset estimation module 518 of FIG. 5 that output a control signal $\{c_d\}$ including both offset and MRA control components, the MRA/offset estimation module 618 may output an offset control signal $\{O\}$ to the digital offset compensation module 622, and an MRA control signal $\{\mu\}$ to digital MRA compensation module 624. Referring back to FIG. 4, the architecture of system 600 would mean dividing the digital MRA and offset compensation module 416 into its two constituent blocks (denoted by dashed lines), including the offset compensation component 420 and the MRA compensation component 422. In FIG. 6, the signal $\{x''_k\}$ output from the digital offset compensation block 622 to the digital MRA compensation block 624 may be free of DC offsets, but has no MRA compensation applied. As a result, these samples may be far better suited to be applied to the subsystems comprising DBE Blocks non-MRAC 620. Accordingly, the architecture of system 600 may address the three difficulties of MRA compensation discussed herein, without the DC offset issues that may arise in system 500.

Figure 7:
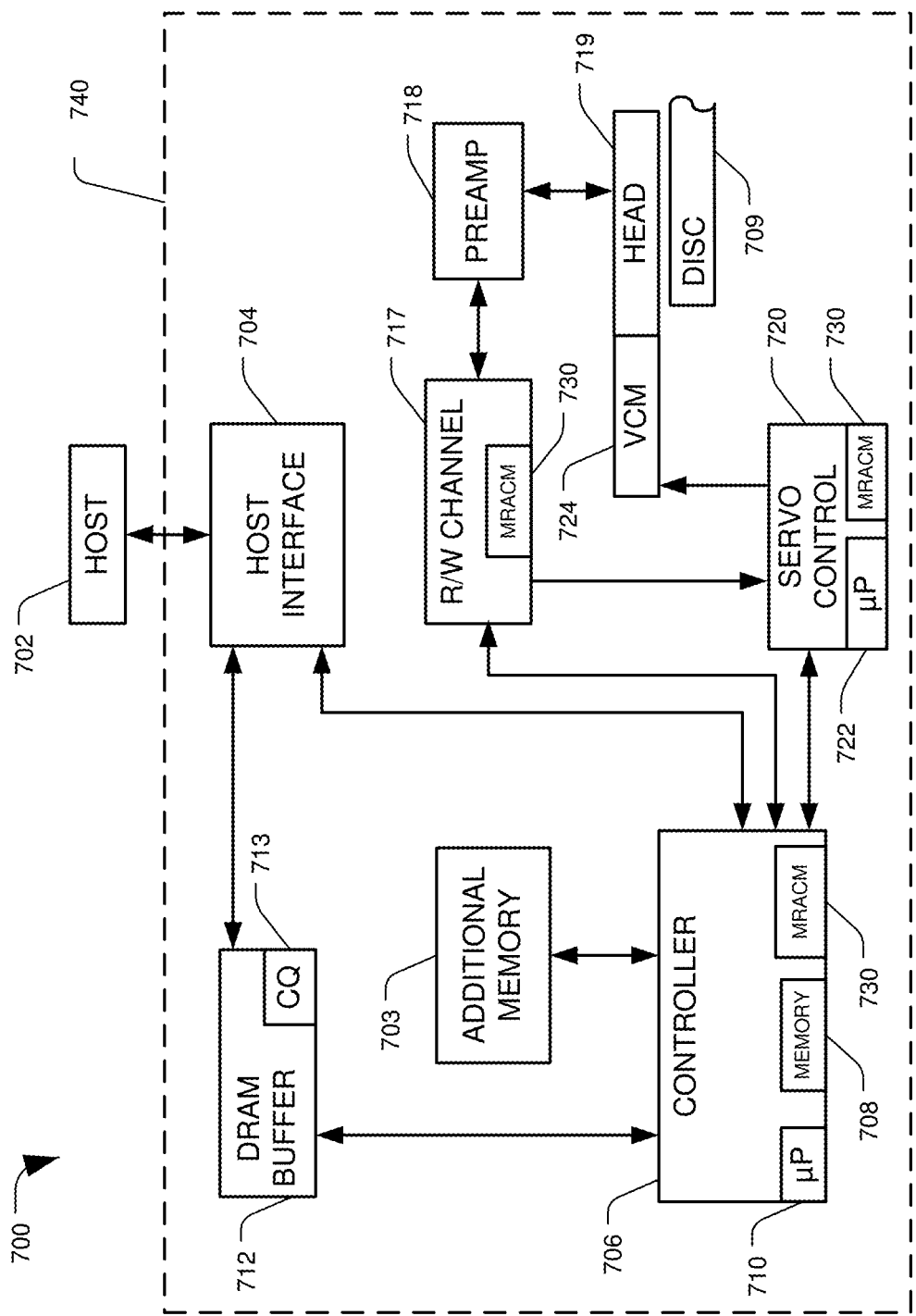
FIG. 7 is a diagram of a system configured for magnetoresistive asymmetry compensation, in accordance with certain embodiments of the present disclosure.

FIG. 7 is a diagram of a system, generally designated 700, configured for magnetoresistive asymmetry compensation, in accordance with certain embodiments of the present disclosure. Specifically, FIG. 7 provides a functional block diagram of an example data storage device (DSD) 700, which may incorporate architecture for MRA compensation, such as system 100 of FIG. 1, system 300 of FIG. 3, system 500 of FIG. 5, or system 600 of FIG. 6. The DSD 700 may also be referred to as hard disc drive (HDD) 700, or a hybrid hard drive (HHD) according to some embodiments. The DSD 700 can communicate with a host device 702 via a hardware or firmware-based interface circuit 704. The interface 704 may comprise any interface that allows communication between a host 702 and a DSD 700, either wired or wireless, such as USB (universal serial bus), IEEE (Institute of Electrical and Electronics Engineers standard) 1394, Compact Flash, SATA (Serial AT Attachment), eSATA (External SATA), PATA (Parallel AT Attachment), SCSI (Small Computer System Interface), SAS (Serial Attached SCSI), PCIe (Peripheral Component Interconnect Express), Fibre Channel, Ethernet, or Thunderbolt, among others. The interface 704 may include a connector that allows the DSD 700 to be physically removed from the host 702. The DSD 700 may have a casing 740 housing the components of the DSD 700.

The buffer 712 can temporarily store data during read and write operations, and can include a command queue (CQ) 713 where multiple operations can be temporarily stored pending execution. Commands arriving over the interface 704 may automatically be received in the CQ 713 or may be stored there by controller 706, interface 704, or another component.

The DSD 700 can include a programmable controller 706, which can include associated memory 708 and processor 710. The controller may execute firmware (FW) (e.g. instructions stored to a memory, such as additional memory 703) to control the operations of the DSD 700. The controller 706 may control data access operations, such as reads and writes, to one or more memories, such as disc memory 709, additional memory 703, or any combination thereof. For example, additional memory 703 may include volatile memory such as dynamic random access memory (DRAM) or static RAM (SRAM), nonvolatile solid state memory such as NAND flash memory, read-only memory (ROM), or other memory types. The additional memory 703 can function as a working memory for storing temporary data, a cache to store recently or frequently read or written data, or data likely to be read soon, or for other temporary data storage. Additional memory 703 may also function as main long-term storage instead of or in addition to disc(s) 709. A DSD 700 containing multiple types of nonvolatile storage mediums, such as a disc(s) and flash, may be referred to as a hybrid storage device or HHD. The memory 708 may similarly include DRAM, SRAM, or similar volatile memory, and may store FW instructions during device operation, cached data, or other information.

The DSD 700 can include a read-write (R/W) channel 717, which can encode data during write operations and reconstruct user data retrieved from a memory, such as disc(s) 709, during read operations. A preamplifier circuit (preamp) 718 can apply write currents to the head(s) 719 and provides pre-amplification of read-back signals. Head(s) 719 may include a read head element and a write head element. A servo control circuit 720 may use servo data to provide the appropriate current to the primary actuator 724, sometimes called a voice coil motor (VCM), to position the head(s) 719 over a desired area of the disc(s) 709 by moving an adjustable arm on which the head(s) 719 are mounted. The controller 706 can communicate with a processor 722 of the servo control circuit 720 to move the head(s) 719 to the desired locations on the disc(s) 709 during execution of various pending commands in the command queue 713.

The DSD 700 may include a magnetoresistive asymmetry compensation module (MRACM) 730. The MRACM 730 may be a processor, controller, or other circuit; it may be a set of software instructions that, when executed by a processing device, perform the functions of the MRACM 730; or it may be a combination of hardware and instruction elements. In some embodiments, the MRACM 730 may be part of or executed by the R/W channel 717, part of controller 706, part of the servo controller 720, incorporated into other elements of the DSD 700, a standalone component within the DSD 700, or any combination thereof. The MRACM 730 may control operations of DSD 700 relating to adjusting for magnetoresistive asymmetry, such as the architectures describes in FIG. 1, FIG. 3, FIG. 5, or FIG. 6. The following flowcharts depict example embodiments of implementing magnetoresistive asymmetry compensation with the various architectures presented herein.

Figure 8:
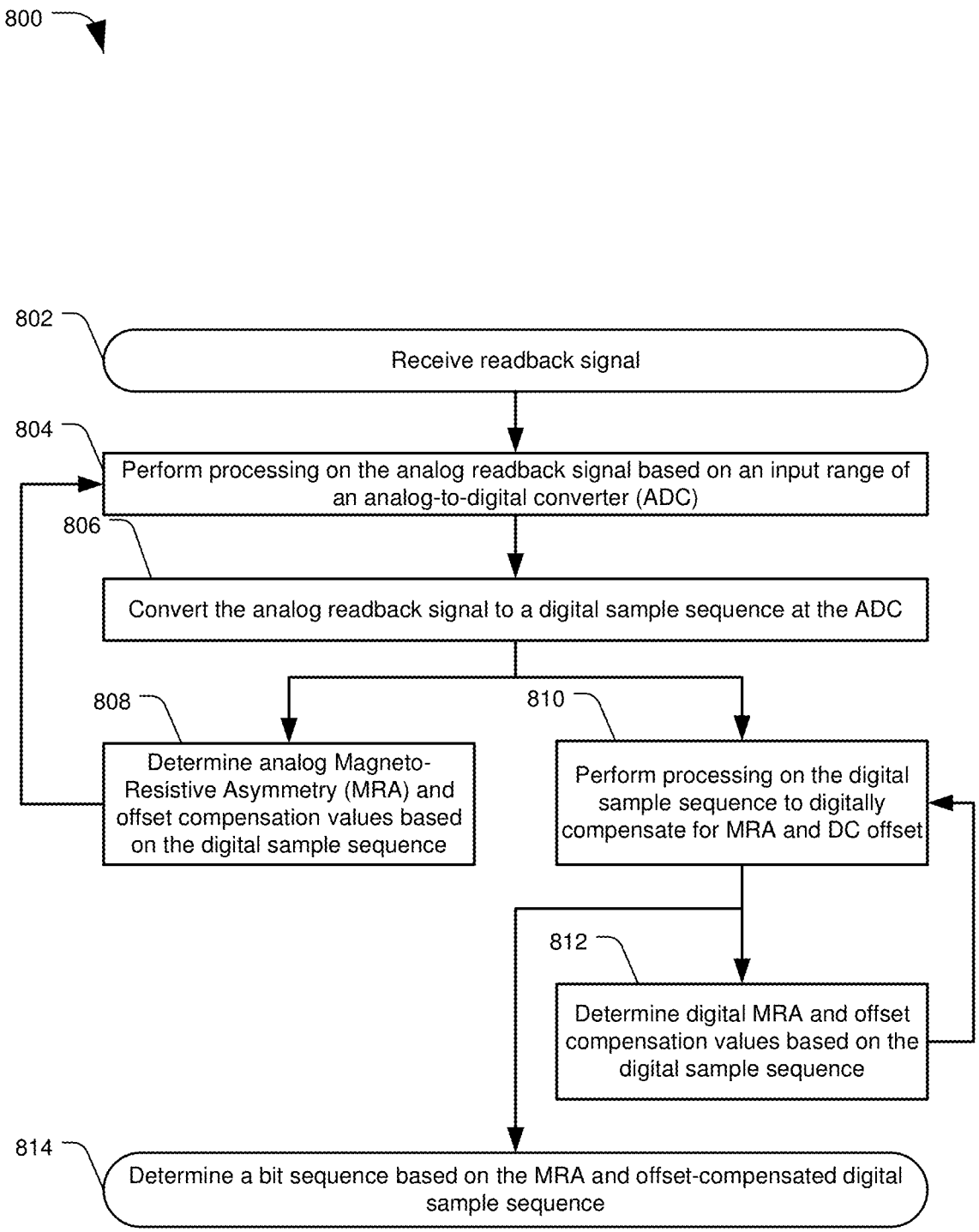
FIG. 8 depicts a flowchart of an example method for magnetoresistive asymmetry compensation, in accordance with certain embodiments of the present disclosure.

FIG. 8 depicts a flowchart of an example method 800 for magnetoresistive asymmetry compensation, in accordance with certain embodiments of the present disclosure. Method 800 may be performed by a data storage device, for example using system 300 of FIG. 3. Method 800 may include an example process for compensating for magnetoresistive asymmetry using a hybrid analog and digital compensation scheme.

The method 800 may include receiving a readback signal, at 802. For example, the readback signal may be an analog signal received by a read head element of a HDD, or received at a continuous-time front end (CTFE) element 306 or a data processing channel. At 804, the method 800 may include performing processing on the analog readback signal, for example to adjust the gain, DC offset, and MRA influences to take full advantage of a dynamic input range of an analog-to-digital converter (ADC or A/D). The processing of 804 may be performed by components of CTFE 306, such as a variable gain amplifier or a magnetoresistive asymmetry compensation circuit (MRACC) 314. In some examples, the processing may include applying a selected fixed or nominal MRA compensation value, rather than having the MRA compensation value adapt in the analog domain. This may result in the analog signal still having residual MRA influences after processing.

The method 800 may include converting the processed analog readback signal to a digital sample sequence, for example using an ADC 308, at 806. The output digital sample sequence may then be provided to multiple components of system 300. For example, the digital sample sequence may be sent to an MRA/offset estimation module 312, where the method 800 may include determining offset compensation values to apply in the analog domain, at 808. While the MRA compensation values may be fixed during normal user data read operations, in some embodiments, MRA compensation values may also be determined and returned, for example during adjustment of MRA compensation values during test reads between normal data reads. The determined analog compensation values may be provided back to the CTFE 306, which may perform further processing, at 804.

The digital sample sequence from the ADC may also be provided to a digital compensation subsystem or circuit 315. For example, the method 800 may include a digital MRA/offset compensation circuit 316 of the subsystem 315 performing processing on the digital sample sequence to digitally compensate for MRA and DC offset, at 810. The output of digital compensation circuit 316 can, in turn, also be provided to multiple components. For example, the processed digital sample sequence may be provided to an MRA/offset estimation circuit 318 of the subsystem 315. The method 800 may include the estimation circuit 318 determining digital MRA and offset compensation values based on the digital sample sequence, at 812, and providing those digital compensation values back to the compensation circuit 316 for further processing, at 810.

The processed digital sample sequence from the compensation circuit 316 may also be provided to a digital backend (DBE) 310. The method 800 may include determining a bit sequence based on the MRA and offset-compensated digital sample sequence, at 814. Compensating for MRA and offset effects using a hybrid analog and digital compensation architecture may enable the DBE to extract user or information bits from the received analog readback signals. Further improvements may be realized by employing an all-digital compensation architecture, an example process for which is described in regard to FIG. 9.

Figure 9:
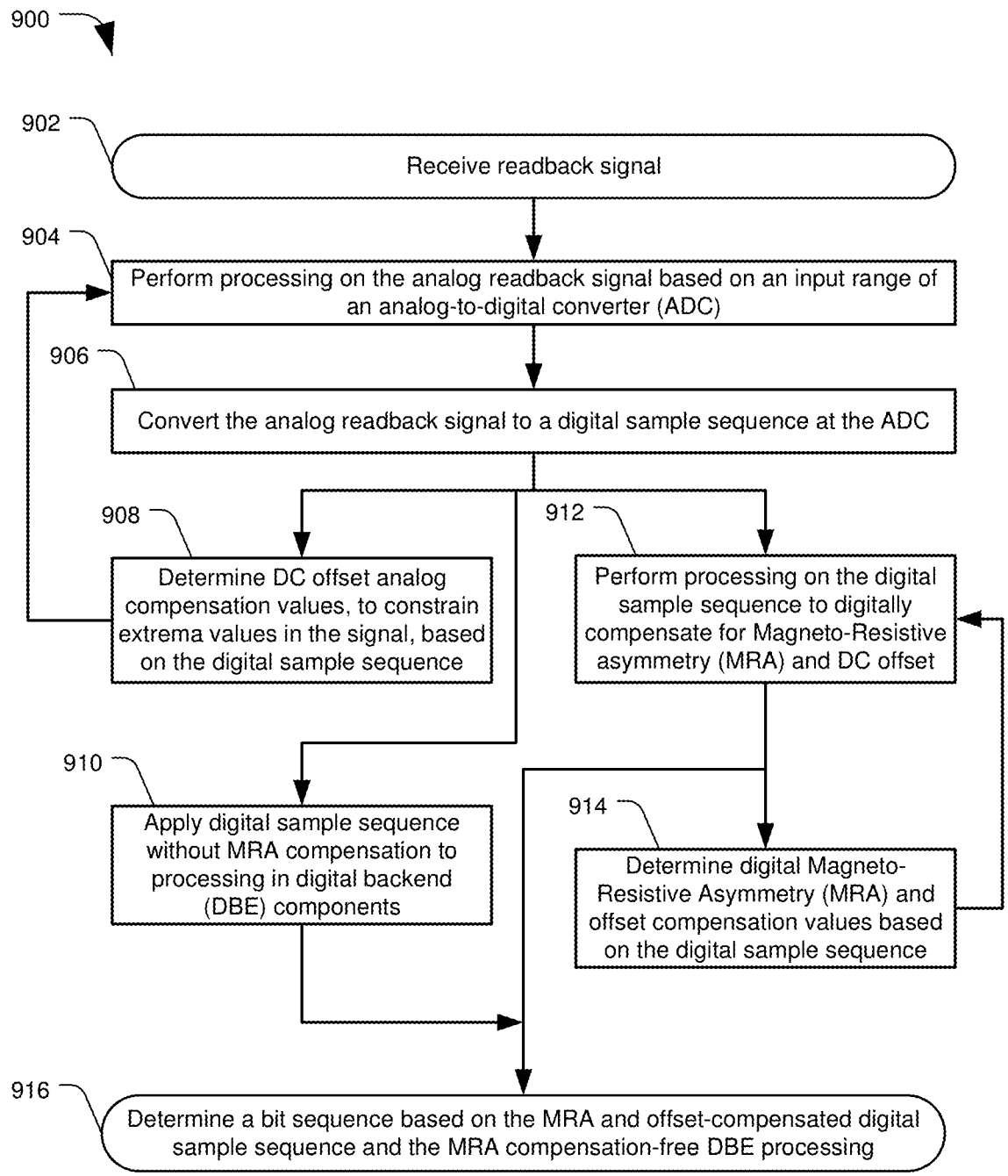
FIG. 9 depicts a flowchart of an example method for magnetoresistive asymmetry compensation, in accordance with certain embodiments of the present disclosure.

FIG. 9 depicts a flowchart of an example method 900 for magnetoresistive asymmetry compensation, in accordance with certain embodiments of the present disclosure. Method 900 may be performed by a data storage device, for example using system 500 of FIG. 5. Method 900 may include an example process for compensating for magnetoresistive asymmetry using an all-digital MRA compensation scheme.

Method 900 may include receiving a readback signal, at 902. At 904, the method may include performing processing on the analog readback signal, for example using CTFE' 506, based on an input range of an ADC 508. However, the processing at 904 may instead include adjusting gain and offset, but may not include performing any MRA compensation. At 906, the method 900 may include converting the processed analog readback signal to a digital sample sequence, for example using an ADC 508. The output sample sequence may be provided to three components.

First, the digital sample sequence may be provided to an offset estimator module, such as gain/offset estimator 512. Method 900 may include determining DC offset analog compensation values, configured to constrain extrema values in the analog signal, rather than pushing the signal to a zero-mean, based on the digital sample sequence, at 908. The offset compensation values may be provided back to CTFE' 506, which may subsequently perform further processing, at 904.

Second, at 910, the method 900 may include applying the digital sample sequence from the ADC 508, which may include no MRA compensation, to processing in some components 520 of a digital backend (DBE) 510.

Third, the method 900 may include performing processing on the digital sample sequence from the ADC 508 to digitally compensate for MRA and DC offset, for example using a digital MRA/offset compensation module 516, at 912. The processed samples may then be provided to multiple components. At 914, the method 900 may include determining digital MRA and offset compensation values based on the processed digital sample sequence, for example using an MRA/offset estimation module 518. The digital compensation values may be provided back to the digital MRA/offset compensation module 516, which may perform further processing at 912.

Figure 10:
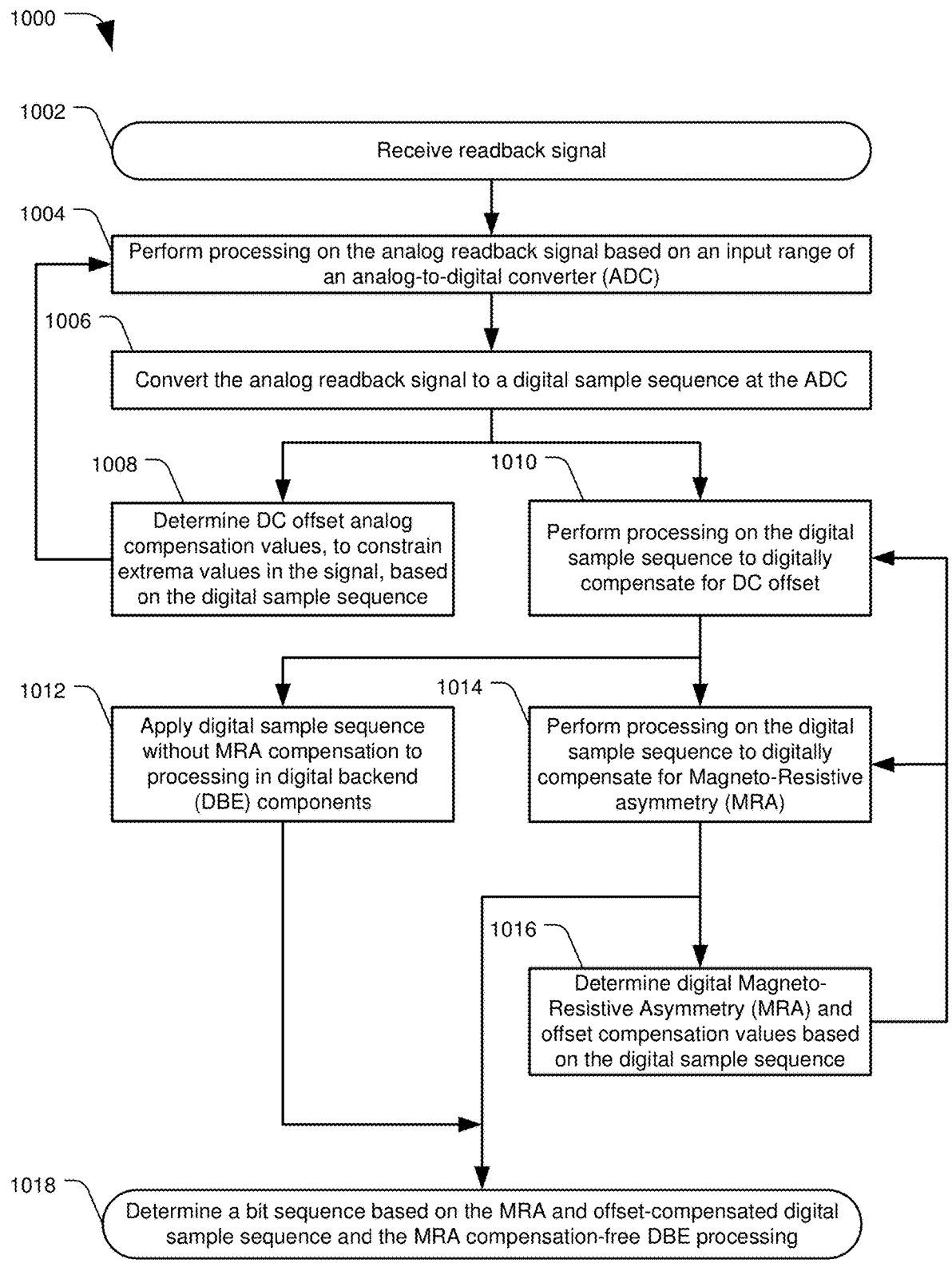
FIG. 10 depicts a flowchart of an example method for magnetoresistive asymmetry compensation, in accordance with certain embodiments of the present disclosure.

The processed digital sample sequence may also be provided to the DBE. At 916, the method 900 may include determining a bit sequence based on the MRA and offset-compensated digital sample sequence, from 912, and the MRA compensation-free DBE processing, at 910. Although method 900 provides numerous benefits over analog-based MRA compensation, and allows DBE processing of non-MRA compensated signal samples, it may still result in performing some DBE processing on non-zero mean signal samples, which may potentially lower performance in detecting user bits from the readback signal. FIG. 10 provides an example method for addressing this issue.

FIG. 10 depicts a flowchart of an example method 1000 for magnetoresistive asymmetry compensation, in accordance with certain embodiments of the present disclosure. Method 1000 may be performed by a data storage device, for example using system 600 of FIG. 6. Method 1000 may include an example process for compensating for magnetoresistive asymmetry using an all-digital MRA compensation scheme. In particular, method 1000 provides an improved process over method 900, allowing for DBE processing of signal samples that have not received MRA compensation, but that have been offset-adjusted to a zero-mean signal. Steps 1002 through 1008 of method 1000 may correspond to steps 902 through 908 of FIG. 9, and so will not be addressed again for the sake of brevity.

Method 1000 may include performing processing on the digital sample sequence from the ADC 608 to digitally compensate for DC offset, at 1010. For example, the offset compensation may be performed by a digital offset compensation module 622, prior to performing any MRA compensation. The offset-compensated sample sequence may be provided to multiple components.

First, at 1012, the method 1000 may include applying the digital sample sequence without MRA compensation to processing in digital backend (DBE) components 620. Because the sample sequence being processed has been offset-compensated to approximately zero-mean, but has not been MRA compensated, it may be optimized for processing by certain components of the DBE.

Second, at 1014, the method 1000 may include performing processing on the offset-compensated digital sample sequence to digitally compensate for MRA, for example using a digital MRA compensation module 624. The offset- and MRA-compensated sample sequence may again be provided to multiple components. At 1016, the method 1000 may include determining digital MRA and offset compensation values based on the digital sample sequence, for example using an MRA/offset estimation module 618. The offset compensation values may be provided back to the digital offset compensation module 622 for further processing, at 1010. The MRA compensation values may be provided back to the digital MRA compensation module 624 for further processing, at 1014.

The digital offset- and MRA-compensated sample sequence may also be provided to the DBE. At 1018, the method 1000 may include determining a bit sequence based on the MRA and offset-compensated digital sample sequence, from 1014, and based on the MRA compensation-free DBE processing, from 1012.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Steps depicted in the flowcharts may optionally be excluded, added, performed in a different order, or performed with different degrees of concurrency than shown (e.g. steps depicted as sequential may be performed concurrently). Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a continuous-time front end (CTFE) configured to:
   receive an analog signal;
   perform analog offset compensation, configured to constrain an extremum of the analog signal to adjust a dynamic range of the analog signal based on an input range of an analog-to-digital converter (ADC), rather than to modify the analog signal to have a zero mean;
   the ADC, configured to convert the analog signal to a digital sample sequence;
   a digital magnetoresistive asymmetry (MRA) compensation circuit configured to perform digital MRA compensation on the digital sample sequence;
   a digital backend (DBE) subsystem configured to receive the digital sample sequence prior to digital MRA compensation; and a DBE configured to produce a bit sequence corresponding to the analog signal based on an output of the DBE subsystem and an output of the digital MRA compensation circuit.

2. The apparatus of claim 1 further comprising:
a digital offset compensation circuit configured to perform digital offset compensation on the digital sample sequence to generate an offset-compensated digital sample sequence; and
the digital sample sequence received by the digital MRA compensation circuit and the DBE subsystem is the offset-compensated digital sample sequence.

3. The apparatus of claim 2 further comprising:
a digital MRA and offset estimation circuit configured to:
 receive an MRA-compensated digital sample sequence from the digital MRA compensation circuit;
 determine an MRA compensation value based on the MRA-compensated digital sample sequence;
 determine an offset compensation value based on the MRA-compensated digital sample sequence;
 provide the MRA compensation value to the digital MRA compensation circuit for use in the digital MRA compensation; and
 provide the offset compensation value to the digital offset compensation circuit for use in the digital offset compensation.

4. The apparatus of claim 1 further comprising:
a magnetic disc storage medium;
a read element configured to:
 detect a magnetic field from the magnetic disc storage medium;
 generate the analog signal based on the magnetic field;
 provide the analog signal to the CTFE; and
a read/write channel including the CTFE, the ADC, the digital MRA compensation circuit, the DBE subsystem, and the DBE.

5. The apparatus of claim 4 further comprising the DBE subsystem configured to use non-linearities in the digital sample sequence to discern a deviation of the read element from a written track center of the magnetic disc storage medium.

6. The apparatus of claim 1 further comprising:
an offset estimation circuit configured to:
 receive the digital sample sequence from the ADC;
 compare a sample from the digital sample sequence to a positive threshold and to a negative threshold;
 set an update signal to a first non-zero value when the sample from the digital sample sequence is larger than the positive threshold or smaller than the negative threshold; and
 provide the update signal to the CTFE for use in the analog offset compensation.

7. The apparatus of claim 6 comprising the offset estimation circuit further configured to set the update signal to a zero value when the sample is not larger than the positive threshold and not smaller than the negative threshold.

8. The apparatus of claim 6 further comprising:
the offset estimation circuit includes a gain estimation circuit configured to estimate a gain adjustment based on the digital sample sequence;
the update signal includes the gain adjustment; and
the CTFE include a variable gain amplifier configured to adjust a gain of the analog signal based on the gain adjustment.

9. The apparatus of claim 1 further comprising:
an MRA estimation circuit configured to:
 receive an MRA-compensated digital sample sequence from the digital MRA compensation circuit;
 determine a digital MRA compensation value based on the MRA-compensated digital sample sequence; and
 provide the digital MRA compensation value to the digital MRA compensation circuit for use in the digital MRA compensation.

10. A method comprising:
receiving an analog signal at a continuous-time front end (CTFE) circuit;
performing, via the CTFE circuit, analog offset compensation configured to constrain an extremum of the analog signal to adjust a dynamic range of the analog signal based on an input range of an analog-to-digital converter (ADC), rather than to modify the analog signal to have a zero mean;
converting the analog signal to a digital sample sequence via the ADC;
performing, via a digital magnetoresistive asymmetry (MRA) compensation circuit, digital MRA compensation on the digital sample sequence;
receiving, via a digital backend (DBE) subsystem, the digital sample sequence prior to digital MRA compensation; and
generating, via a DBE, a bit sequence corresponding to the analog signal based on an output of the DBE subsystem and an output of the digital MRA compensation circuit.

11. The method of claim 10 further comprising:
performing, via a digital offset compensation circuit, digital offset compensation on the digital sample sequence to generate an offset-compensated digital sample sequence; and
the digital sample sequence received by the digital MRA compensation circuit and the DBE subsystem is the offset-compensated digital sample sequence.

12. The method of claim 11 further comprising:
receiving, via a digital MRA and offset estimation circuit, an MRA-compensated digital sample sequence from the digital MRA compensation circuit;
determining, via the digital MRA and offset estimation circuit, an MRA compensation value and an offset compensation value based on the MRA-compensated digital sample sequence;
providing the MRA compensation value to the digital MRA compensation circuit for use in the digital MRA compensation; and
providing the offset compensation value to the digital offset compensation circuit for use in the digital offset compensation.

13. The method of claim 10 further comprising determining, via the DBE subsystem, a deviation of a reader from a written track center of a magnetic disc storage medium using non-linearities in the digital sample sequence.

14. The method of claim 10 further comprising:
receiving, via an offset estimation circuit, the digital sample sequence from the ADC;
setting, at the offset estimation circuit, an update signal to:
 a non-zero value when a sample from the digital sample sequence is one of:
  a) larger than a positive threshold, and
  b) smaller than a negative threshold; and
 a zero value when the sample is not larger than the positive threshold and not smaller than the negative threshold; and
providing the update signal to the CTFE for use in the analog offset compensation.

15. The method of claim 10 further comprising:
receiving, at an MRA estimation circuit, an MRA-compensated digital sample sequence from the digital MRA compensation circuit;
determining, via the MRA estimation circuit, a digital MRA compensation value based on the MRA-compensated digital sample sequence; and
providing the digital MRA compensation value to the digital MRA compensation circuit for use in the digital MRA compensation.

16. A memory device storing instructions that, when executed, cause a processor to perform a method comprising:
receiving an analog signal at a continuous-time front end (CTFE) circuit;
performing, via the CTFE circuit, analog offset compensation configured to constrain an extremum of the analog signal to adjust a dynamic range of the analog signal based on an input range of an analog-to-digital converter (ADC), rather than to modify the analog signal to have a zero mean;
converting the analog signal to a digital sample sequence via the ADC;
performing, via a digital magnetoresistive asymmetry (MRA) compensation circuit, digital MRA compensation on the digital sample sequence;
receiving, via a digital backend (DBE) subsystem, the digital sample sequence prior to digital MRA compensation; and
generating, via a DBE, a bit sequence corresponding to the analog signal based on an output of the DBE subsystem and an output of the digital MRA compensation circuit.

17. The memory device of claim 16 storing instructions that, when executed, cause the processor to perform the method further comprising:
performing, via a digital offset compensation circuit, digital offset compensation on the digital sample sequence to generate an offset-compensated digital sample sequence; and
the digital sample sequence received by the digital MRA compensation circuit and the DBE subsystem is the offset-compensated digital sample sequence.

18. The memory device of claim 17 storing instructions that, when executed, cause the processor to perform the method further comprising:
receiving, via a digital MRA and offset estimation circuit, an MRA-compensated digital sample sequence from the digital MRA compensation circuit;
determining, via the digital MRA and offset estimation circuit, an MRA compensation value and an offset compensation value based on the MRA-compensated digital sample sequence;
providing the MRA compensation value to the digital MRA compensation circuit for use in the digital MRA compensation; and
providing the offset compensation value to the digital offset compensation circuit for use in the digital offset compensation.

19. The memory device of claim 16 storing instructions that, when executed, cause the processor to perform the method further comprising:
determining, via the DBE subsystem, a deviation of a reader from a written track center of a magnetic disc storage medium using non-linearities in the digital sample sequence.

20. The memory device of claim 16 storing instructions that, when executed, cause the processor to perform the method further comprising:
receiving, via an offset estimation circuit, the digital sample sequence from the ADC;
setting, at the offset estimation circuit, an update signal to:
a non-zero value when a sample from the digital sample sequence is larger than a positive threshold or smaller than a negative threshold; and
a zero value when the sample is not larger than the positive threshold and not smaller than the negative threshold; and
providing the update signal to the CTFE for use in the analog offset compensation.

* * * * *